United States Patent
Follmann et al.

(10) Patent No.: US 10,662,546 B2
(45) Date of Patent: May 26, 2020

(54) METHOD AND SYSTEM FOR PRODUCING CRYSTALLINE CALCIUM CARBONATE BY THE COMBINED USE OF TWO GASES WITH DIFFERENT $CO_2$ CONTENT

(71) Applicant: PAPIERFABRIK AUGUST KOEHLER SE, Oberkirch (DE)

(72) Inventors: Heinrich Follmann, Berlin (DE); Berit Hillbrecht, Dahlwitz-Hoppegarten (DE)

(73) Assignee: PAPIERFABRIK AUGUST KOEHLER SE, Oberkirch (DE)

( * ) Notice: Subject to any disclaimer, the term of this patent is extended or adjusted under 35 U.S.C. 154(b) by 0 days.

(21) Appl. No.: 14/782,024

(22) PCT Filed: Mar. 26, 2014

(86) PCT No.: PCT/EP2014/056083
§ 371 (c)(1),
(2) Date: Oct. 2, 2015

(87) PCT Pub. No.: WO2014/161758
PCT Pub. Date: Oct. 9, 2014

(65) Prior Publication Data
US 2016/0032481 A1  Feb. 4, 2016

(30) Foreign Application Priority Data
Apr. 3, 2013  (EP) .................... 13162162

(51) Int. Cl.
*C30B 7/14* (2006.01)
*C01F 11/18* (2006.01)
*C30B 29/10* (2006.01)

(52) U.S. Cl.
CPC .............. *C30B 7/14* (2013.01); *C01F 11/181* (2013.01); *C30B 29/10* (2013.01);
(Continued)

(58) Field of Classification Search
CPC . C01F 11/181; C01P 2004/10; C01P 2004/38; C01P 2004/39; C01P 2004/45;
(Continued)

(56) References Cited

U.S. PATENT DOCUMENTS 3,320,026 A * 5/1967 Waldeck ............. C01F 11/16
423/432
3,761,521 A  9/1973 Alheritiere et al.
(Continued)

FOREIGN PATENT DOCUMENTS

DE  19943093 A1  3/2001
EP  1637501 A1  3/2006
(Continued)

OTHER PUBLICATIONS

PCT Search Report from PCT/EP2014/056083.

*Primary Examiner* — Hua Qi
(74) *Attorney, Agent, or Firm* — Fay Sharpe LLP

(57) ABSTRACT

The invention relates to a particularly energy efficient, two-step method and to a system for the continuous or semicontinuous production of crystalline calcium carbonate (precipitated calcium carbonate, PCC) by reacting calcium hydroxide with $CO_2$, the calcium hydroxide being lime milk. In the first step of the germination, the $CO_2$-source is exclusively flue gas having a $CO_2$-content of between 4-25% <sb/><sb/>. In the second step, the complete conversion of the lime milk reacted in the first step to a maximum of 90%, preferably between 10-90%, is carried out exclusively using a rich gas which comprises 30-99% $CO_2$, preferably using biogas.

13 Claims, 4 Drawing Sheets

(52) U.S. Cl.
CPC ...... *C01P 2004/10* (2013.01); *C01P 2004/38* (2013.01); *C01P 2004/39* (2013.01); *C01P 2004/45* (2013.01); *C01P 2004/61* (2013.01); *C01P 2004/62* (2013.01); *C01P 2006/12* (2013.01)

(58) Field of Classification Search
CPC .............. C01P 2004/61; C01P 2004/62; C01P 2006/12; C12Q 1/68; C30B 29/10; C30B 7/14; H04L 45/3065; H04L 65/1006; H04L 65/01
See application file for complete search history.

(56) References Cited

U.S. PATENT DOCUMENTS

| | | | |
|---|---|---|---|
| 4,133,894 A | 1/1979 | Shibazaki et al. | |
| 4,710,300 A * | 12/1987 | Kristoufek | B09B 3/00 210/603 |
| 5,695,733 A | 12/1997 | Kroc et al. | |
| 6,436,232 B1 * | 8/2002 | Silenius | D21C 9/004 162/181.2 |
| 2002/0007925 A1 * | 1/2002 | Rheims | D21C 9/004 162/9 |
| 2002/0172636 A1 * | 11/2002 | Nover | C01F 11/181 423/432 |
| 2006/0129020 A1 * | 6/2006 | Barends | F23C 9/08 588/314 |
| 2009/0081112 A1 | 3/2009 | Virtanen | |
| 2010/0031670 A1 * | 2/2010 | Hoffman | F01D 15/10 60/793 |

FOREIGN PATENT DOCUMENTS

| | | |
|---|---|---|
| EP | 2599750 A1 | 6/2013 |
| WO | 2008128776 A2 | 10/2008 |

* cited by examiner

METHOD AND SYSTEM FOR PRODUCING CRYSTALLINE CALCIUM CARBONATE BY THE COMBINED USE OF TWO GASES WITH DIFFERENT $CO_2$ CONTENT

BACKGROUND OF THE INVENTION

The invention relates to an especially energy-efficient two-step method and to a system for continuous or semi-continuous production of crystalline calcium carbonate (precipitated calcium carbonate, PCC) by reacting calcium hydroxide with $CO_2$, the calcium hydroxide being milk of lime. Flue gas is exclusively used as $CO_2$ source in the first step of the nucleation and has a $CO_2$ content of 4-25%. In the second step, the complete conversion of the milk of lime reacted in the first step to a maximum of 90%, preferably from 10 to 90%, is operated exclusively using a rich gas which comprises 30 to 99% of $CO_2$, preferably using biogas.

The method according to the invention furthermore effects the simultaneous cleaning of the biogas preferably used which is purified to give biomethane by depletion of the $CO_2$. The biomethane obtained by the method according to the invention preferably still has a $CO_2$ content of from 0.1 to 3%.

Using the method according to the invention and the associated system, the required amount of $CaCO_3$ may always be produced in the desired morphology with especially high energetic efficiency and especially high volumetric productivity in line with demand and independently of fluctuations in the provision of the rich gas, e.g. the biogas, by additional use of flue gas.

According to the prior art, a multiplicity of methods are known in which PCC is formed in aqueous suspension from $Ca(OH)_2$ with introduction of $CO_2$ (usually from flue gases). Thereafter, liquid $CO_2$ or $CO_2$-containing flue gases are introduced into milk of lime using differing ventilation systems and frequently with the aid of additives or seed crystals, the desired morphologies are generated. On an industrial scale, usually the batch operation is employed, some methods of continuous PCC production also being known.

For example, DE 199 43 093 A1 describes a method for the continuous production of $CaCO_3$ which is characterized by a nucleation phase and seed growth phase which are separate from one another. The concentration of the milk of lime and the quantitative ratio of $Ca(OH)_2/CaCO_3$ thereafter determine the crystal size. Energetic aspects or the complete utilization of the $CO_2$ contained in the gas stream are not considered.

EP 2 139 831 discloses a method for cleaning biogas, in which $CaCO_3$ is formed simultaneously in crystalline form (PCC) and can be supplied to commercialization. As is known, this method leads to two possibilities for adding value—biomethane which is ready to feed into the grid and PCC in the form of a functional crystal.

Flue gases that are usually used for producing PCC, in contrast to biogas, typically have a markedly lower $CO_2$ content. The production of precipitated calcium carbonate in approaches carried out in standard batchwise methods is energetically demanding, since independently of the selection of the $CO_2$ input system, a large amount of inert gases need to be conjunctionally transported, compressed and introduced. In industrial practice, the lower limit of economic operation with flue gases is considered to be at a $CO_2$ content of these flue gases from about 11% to 15%. At these low $CO_2$ contents of the flue gases, then specific mean energy consumption figures result which are in the range of most conventional gas-introduction apparatuses at values from 170 kWh to 190 kWh per ton of PCC. At a mean energy price of about €0.075 per kWh, the energy factor at this point is already of major importance with approximately €13 to 14 per ton of PCC.

A further disadvantage in the use of flue gases is that they must be cooled to approximately 40° C. before intake into the compressor stage. If the flue gases that are in the temperature range from 80° C. to 110° C. were to be fed uncooled to the compressor stage, after the required compression to typically 0.5 to 0.7 bar, gas temperatures far above 120° C. would result. However, such high temperatures with all known gas-introduction systems, owing to steam formation, lead to cavitation, which leads to a considerably decreased material introduction. Cooling is therefore indispensable, but it is expensive in terms of energy and therefore it is an additional not inconsiderable cost factor for PCC production. In a medium PCC onsite system which is operated with about 25 000 $Nm^3$ of converted flue gas, for cooling a refrigeration output of about 5 MW to 6 MW must be applied, depending on the water vapor content and level of the intake temperature. In cost terms this has an effect of about 0.7 MW per ton of PCC or depending on the type of generation of the refrigeration energy works out at about €6 per ton of PCC (calculated with an average €0.01 per $kWh_{thermal}$). In the case of simple scalenohedral quality grades in the usage range of fillers, the generator prices are only €100 to 120/t, therefore the cooling costs already at this point represent approximately 5% of the total production costs.

BRIEF SUMMARY

It is therefore the aim of the present invention to provide a method and a system for especially energy-efficient production of precipitated PCC. At the same time, the method and the system should be designed in such a manner that fundamentally any defined crystal type desired by the user can be produced.

The aim of the invention is achieved by a method according to claim 1 and the especial embodiments of the subclaims. The method according to the invention for producing crystalline calcium carbonate by reacting calcium hydroxide with $CO_2$, the calcium hydroxide being provided as milk of lime and the method comprising a first step of nucleation of the calcium carbonate nuclei and a subsequent crystal growth step that is separate from the nucleation, is characterized in that a) in the first step the nucleation is carried out continuously with exclusive use of flue gas that comprises 4 to 25% of $CO_2$ in one or more reactors, the fill levels of which are optionally variable, the parameters of the gas-introduction device which introduces flue gas into the reactors being set in dependence on the fill level in the respective reactor in such a manner that 0.3 to 5 $m^3$ of gas/min/$m^3$ of reactor volume are introduced in order to react a maximum of 90% of the milk of lime to calcium carbonate in the first step, preferably 10 to 90%, b) in the second step, crystal growth and crystal stabilization are carried out batchwise with exclusive use of a rich gas that comprises 30 to 99% of $CO_2$ in one or more reactors, the fill levels of which are optionally variable, complete conversion of the partially reacted milk of lime from step a) being controlled by setting independently of one another the parameters of the gas-introduction device that introduces the rich gas into the reactors in the respective reactor.

DETAILED DESCRIPTION

The method is therefore characterized by a single-step to multiple-step continuously operated phase a) of nucleation and also by one or more batchwise operated step(s) b) of crystal ripening and crystal stabilization. The overall method can be carried out continuously or semicontinuously.

The gas-introduction device parameters that are to be set independently of one another are especially the gas-introduction rate and the bubble size in steps a) and b). In a preferred embodiment of the invention, a gas-introduction turbine is used as gas-introduction device, especially a turbine operating with admission pressure. In this case, for controlling the gas-introduction, admission pressure and speed of rotation are set independently of one another. The gas-introduction turbine therefore serves at the same time as an agitator and gas-introduction appliance, with which the reaction is controlled. The gas-introduction turbine can be used in the reactors of steps a) and b), or else only in the reactors of step a).

Step a) of the method according to the invention is carried out with exclusive use of flue gas having a $CO_2$ content of from 4 to 25%, preferably 8 to 20%, and especially preferably from 11 to 17%. The $CO_2$-containing flue gas used in accordance with the invention is an off-gas which is formed in the combustion of fossil fuels or refuse. This is produced, e.g., in lime burning, in power plants, refuse incineration systems or blast furnaces.

According to the invention, the flue gas is fed from a flue gas collector into the reactor(s) of step a) at 30-80° C. Since flue gas is produced industrially generally at approximately 80° C., it is advantageously cooled and decondensed by means of heat exchangers upstream of the introduction into the flue gas collector. The thermal energy obtained in this case can be utilized, e.g., for warming up the fermentation effluence from biogas production in preparation for nitrogen stripping of the fermentation residues, especially in the event that biogas is used as rich gas in step b) of the method according to the invention.

The flue gas is preferably fed into the reactor(s) of step a) by means of a gas-introduction turbine which is operated in a self-priming manner or with admission pressure, preferably a turbine with admission pressure from Frings, Germany. Admission pressure and speed of rotation of the gas-introduction turbine are set in dependence on the fill level in the respective reactor in such a manner that 0.3 to 5 $m^3$ of gas/min/$m^3$ of reactor volume are introduced, in such a manner that, in the first step, only 10 to 90% of the milk of lime is converted. According to the invention, allowing the reactors to run in a state of degree of conversion of more than approximately 90% is to be strictly avoided, since at such high conversion rates—expressed as ratio of $CaCO_3$ already famed to $Ca(OH)_2$ still present—the energetic efficiency is rapidly impaired (cf. FIG. 1).

Preferably, the parameters of the gas-introduction device are set in dependence on the fill level in step a) in such manner that 1 to 3 $m^3$ of gas/min/$m^a$ of reactor volume are introduced, especially preferably 1.5 to 2.5 $m^3$ of gas/mm/$m^3$ of reactor volume. In the case of the Frings turbine typically used, the two electric power consumers, turbine and compressor, are therefore matched to one another in such a manner that maximum gas-introduction is possible at all filling levels.

The Frings gas-introduction turbine operates by the rotor-stator principle. The liquid flows into the working region of the rotor and is conducted thereby radially outwards into the stator channels. Therefore, in the inner region of the rotor, a reduced-pressure region is formed, into which the gas is drawn by suction. The gas is then dispersed with the liquid in the channels of the stator in a turbulent flow. In this manner the Fringe turbine combines the tasks of mixing and gas-introduction in one apparatus.

The working by preference with a variable fill level in the continuously operating step a) is ensured in an embodiment of the invention in that one or more reactors in step a) are connected to an intermediate vessel (cf. FIG. 2) which preferably has the same to one hundred times the volume of the continuously operating reactor connected thereto, especially preferably one to twenty times the reactor volume connected thereto. The intermediate vessel is also connected to the reactors or reactor of step b).

This intermediate vessel can, if necessary, be provided with an agitator and/or a gas-introduction device for the introduction of flue gas.

The stirring prevents the sedimentation of the particles in the suspension, the gas-introduction device prevents the possible conversion of the crystals that are already formed into different crystal types which would adversely affect the quality and homogeneity of the later end product. The stirring and intensity of the gas-introduction can be matched to one another in such a manner that, firstly, a back reaction is safely avoided, secondly a reaction progress is achieved that is small in relation to the specific conversion rate of the preceding step.

Then, independently of the continuously operating first step, the incompletely reacted suspension is transferred from the intermediate vessel into the reactor or reactors of the second step, in which crystal growth and crystal stabilization proceed batchwise, with setting of the desired parameters.

It is also possible according to the invention to take off a partial volume stream from the intermediate vessel and recirculate this into the last (or one of the preceding) reactors operating in the continuous step. This can offer advantages when the gas supply is decreased. Therefore, the intermediate vessel has both a supply and a return to the communicating continuous reactor.

The intermediate vessel therefore serves as a necessary buffer for deficiency operation in the provision of $CO_2$ equivalents, on the one hand, and on the other hand also as a container of variably adjustable fill level which can be filled up to an oversupply of $CO_2$.

In a further embodiment of the invention, the variable fill level can be set for one or more of the continuously operating reactors in step a) by volumetric enlargement of the reactor or reactors by means of an attachment to the respective reactor, the volume of which attachment is preferably the same to twenty times that of the lower part of the reactor. The additional geodetic height of the attachment exceeds the working height of the reactor arranged there beneath preferably by the factor of 1.2 to 7. Especially preferably, the reactor is enlarged by conical attachment.

In an embodiment of the invention, this reactor attachment can be implemented in the following manner. In the lower height fraction of the reactor a cross section is selected which is tailored to the characteristic design criteria of the gas-introduction turbine. The height of the reactor then follows in the ratio of 0.5-2.0 to the actual design criteria of the turbine. From the height of 0.5 to 2.0 times the diameter of the lower part of the reactor, first there occurs a conical expansion of the cross section at an angle of 15 to 45° up to achieving a diameter of 1.5 to times the lower diameter. There follows a further cylinder of larger diameter having a height which is in principle as desired—preferably 1.5 to 3 times the value of the enlarged diameter.

Instead of this embodiment, a continuously conical tank, or a conical attachment can also be applied, which attachment is seated on the lower cylindrical part. Finally, an additional volume is formed which, in comparison with the lower cylindrical part of the reactor, is greater by the factor of 1 to 20 times. The necessarily higher admission pressure of the gas supply stream in this embodiment can be adapted stepwise to the fill level. In the lower part of the reactor, the defined and manageable ratios prevail with respect to mass transfer, mixing and speed of rotation of the liquid. In the upper part of the reactor, states of low mixing and weaker mass transfer dominate, but which are always set in such a manner that a back reaction is prevented at the same time further crystal growth is made possible.

In the second step of the method according to the invention, the partially reacted milk of lime from the first step is end-carboxylated in one or more reactors in the batch method with constant or variable fill level, preferably a constant fill level, up to complete conversion. The $CO_2$ required in this step originates exclusively from a rich gas that has 30 to 99% of $CO_2$, preferably 30 to 60% of $CO_2$, especially preferably 30 to 47% of $CO_2$. This rich gas is preferably biogas, but also industrial gas or flue gas having concentrated. $CO_2$ content may be employed. For concentration of flue gas that contains less than 11%, or even less than 5%, of $CO_2$, for example a modified amine scrubber can be employed. In this case, a rich gas is produced that can contain up to 99% of $CO_2$.

Also introduction of the rich gas in the second stage of the method according to the invention preferably proceeds using a gas-introduction turbine according to the same principle of construction as described above, which is operated in self-priming mode or with admission pressure, and admission pressure and speed of rotation of the gas-introduction turbine are set independently of one another. The complete conversion of the provided $CO_2$ in the second step may be controlled, especially, via the mutually independent setting of speed of rotation, admission pressure, gas-introduction rate and proportional admixture of circulating air in all discontinuous reactors. The reactors of step b) can also be equipped with a different gas-introduction device of markedly simpler type.

The gas spaces/gas collectors of the flue gas section are hermetically separated off from those of the rich gas section, especially biogas section.

The partially converted suspension from the first continuously operated step can be added, as described, to a gas-treated or non-gas-treated intermediate vessel if, temporarily, the capacity of the rich gas, especially biogas, is insufficient (cf. e.g. FIG. 2). The partially converted suspension from the first step can alternately also be brought into a higher degree of conversion which, however, is always less than 90%, based on the total degree of conversion.

The partially converted suspension of the first step can be kept in the same degree of conversion, the fill level being increased and optionally an attachment situated on the reactor is gradually filled (cf. e.g. FIG. 3).

In the event of an oversupply of rich gas, especially biogas, the degree of conversion in the first step is lowered, the suspension having a lower degree of conversion is fed to the reactors of the second step, the capacity of which again can be, by elevating the fill level in combination with the processing settings of the gas throughput—e.g. higher speed of rotation of the gas-introduction turbine—raised in such a manner that the lower partial conversion is compensated for from the continuous step.

For production of desired crystal forms and grain size distributions, in the continuously operating reactors of step a) in which the nucleation is accomplished, in addition to the gas-introduction parameters, preferably the five parameters cited hereinafter are set independently of one another. In this case, exclusively flue gas is used, as described above. These are the calcium hydroxide concentration of the milk of lime and therefore the relative ionic strength of the calcium cation, the mean hydraulic residence time of the milk of lime flowing through the reactor which thereby establishes the median age of the newly formed nuclei, the degree of saturation of the milk of lime with $CO_2$ and therefore of the resulting degree of supersaturation of the active bicarbonate anion, the relative degree of conversion of calcium hydroxide to calcium carbonate which in principle may be set steplessly in a range from less than 10% to 95% from the combination of the calcium hydroxide concentration of the milk of lime in combination with the throughput rate of the milk of lime and finally in combination with the processing characteristics of the gas-introduction device, which can be read off on the corresponding values of the conductivity and the pH, the reaction temperature which may be set by means of a tubular cooler built into the reactor, or an external cooler, to any desired value in the range from 5° C. to 80° C.

The degree of conversion of calcium hydroxide with $CO_2$ can firstly be set via changing the calcium hydroxide concentration in the milk of lime presented in combination with the degree of fineness thereof and/or via controlling the electrical conductivity of the liquid phase in the reactor itself. It is known to those skilled in the art that the conductivity value may be set from a combination of the hydraulic throughput of the milk of lime in combination with the parameters of the gas-introduction device. A higher throughput of the milk of lime leads to higher conductivity values, since the fraction of incompletely reacted $Ca(OH)_2$ increases. A higher speed of rotation of the turbine leads to a greater energy input and therefore to a higher surface area of the $Ca(OH)_2$ crystallites, which in turn has the effect that more $Ca(OH)_2$ can be delivered subsequently into the solution. A higher conductivity value corresponds to a high supersaturation of $Ca(OH)_2$ and vice versa. Conductivity values from 0.1 to 7 mS/cm and above may be set. As is known, the respective conductivity value corresponds to the degree of conversion of $Ca(OH)_2$ to $CaCO_3$. High conversion rates in dynamic equilibrium correspond to low conductivity values and vice versa. The electric conductivity is measured, for example, using a commercially available probe from Ahlborn or WTW (Germany).

The mean hydraulic residence time of the milk of lime in a reactor of step a) (=ratio of the volume stream of the supplied milk of lime to the reactor volume) may be set for any desired conductivity value in a wide range by raising or lowering the fill level of the respective reactor.

The degree of saturation of $CO_2$ in the milk of lime, that is to say the effective concentration of dissolved $CO_2$—this then corresponds to the bicarbonate anion concentration—may be set in the reactor of step a), e.g. by changing the fill level. The fill level of the reactor with milk of lime can be raised and lowered variably in a broad range (between 30% and 100%). As a result, the geodetic height which the gas-introduction turbine must overcome rises or falls. With aeration data otherwise unchanged, the KLA value (mass transfer value) improves or worsens and as a consequence thereof, the concentration of dissolved $CO_2$. Thus, solely via changing the fill level, the degree of supersaturation can be set. In addition, the speed of rotation of the turbine can further be changed with the aim of intensifying or weakening the effect of the change in KLA value.

The present invention also relates to a system for carrying out the method according to the invention. The system has one or more series-connected continuously operating reactors in which a maximum of 90% of the milk of lime is converted to calcium carbonate, which themselves are connected to one or more discontinuously operating reactors in which the partially converted milk of lime from the continuously operated reactors is completely converted, wherein all reactors having gas-introduction systems and also gas feeds and gas returns, the gas feeds and gas returns connecting the respective continuously operating reactor to a flue gas collector and also the respective discontinuously operating reactor to a rich gas collector, and flue gas collector and rich gas collector being separate from one another.

In an embodiment of the invention, the system comprises one or more series-connected continuous reactors (of the step a)), at least one of the continuously operating reactors being connected via supply and return lines to an intermediate vessel and the continuous reactor or reactors themselves and also the intermediate vessel or intermediate vessels being connected to one or more series-connected discontinuously operating reactors (of the step b)).

The intermediate vessel preferably has an agitator and/or a gas-introduction device and also gas feeds and returns to the flue gas collector. Preferably, the intermediate vessel is connected to two discontinuously operating reactors. FIG. 2 shows the basic connection diagram.

In an especially preferred embodiment, the reactors of the step a) are supplied with flue gas having a $CO_2$ content of from 11 to 17%, the reactors of the step b) obtain biogas having a $CO_2$ content of typically 30 to 47%. The reaction temperature of the continuously operating reactors is kept at a constant value by means of internally or externally arranged coolers. In the discontinuously operated reactors of the second step, the heat of reaction can likewise be removed. It is also possible to allow the temperature development to run freely until a temperature equilibrium is established from the exothermic heat of reaction and heat radiation.

In another especially preferred embodiment, a plurality of batch reactors are directly connected to the continuous reactors which operate at constant or also variable fill level and are filled successively with partially converted milk of lime (cf. FIG. 4). The continuously operating reactors are charged with flue gas which is optionally compressed, preferably to approximately 300 mbar, the discontinuously operating reactors are supplied with biogas. The gas-introduction parameters are, as described above, set in a manner that biomethane conforming to specifications that can be fed in is formed.

Another embodiment is shown in FIG. 3. It has a continuously operating reactor which is provided with an attachment for volume enlargement which itself is directly connected to two discontinuously operating reactors. The volume of the attachment is preferably the same to twenty times the lower part of the reactor and the geodetic height of the attachment exceeds that of the working height of the reactor arranged there beneath preferably by the factor of 1.2 to 7. The gas-introduction of the continuously operating reactor proceeds in turn with optionally precompressed flue gas. The flue gas that has reacted to completion leaves the reactor through a separate gas line and is discharged to atmosphere without further treatments. The discontinuous reactors are again supplied with biogas.

The method according to the invention is not only characterized by a high energy efficiency, but it also has the great advantage that a temporarily lower production of rich gas, e.g. a lower production of biogas, can be compensated for by an increase in flue gas and vice versa in the case of increased production of biogas, the fraction of flue gas arriving for processing can correspondingly be decreased. Using the method according to the invention and the system according to the invention, industrial lean gases such as, e.g., flue gas, may be processed with low expenditure in terms of energy in combination with rich gases, such as, e.g., biogas. In addition, using the method according to the invention, all industrially demanded modifications of $CaCO_3$ may also be produced, e.g. scalenohedral calcite, rhombohedral calcite or cubic nano-PCC or else acicular aragonite or amorphous PCC, or basic PCC.

Figure 1:
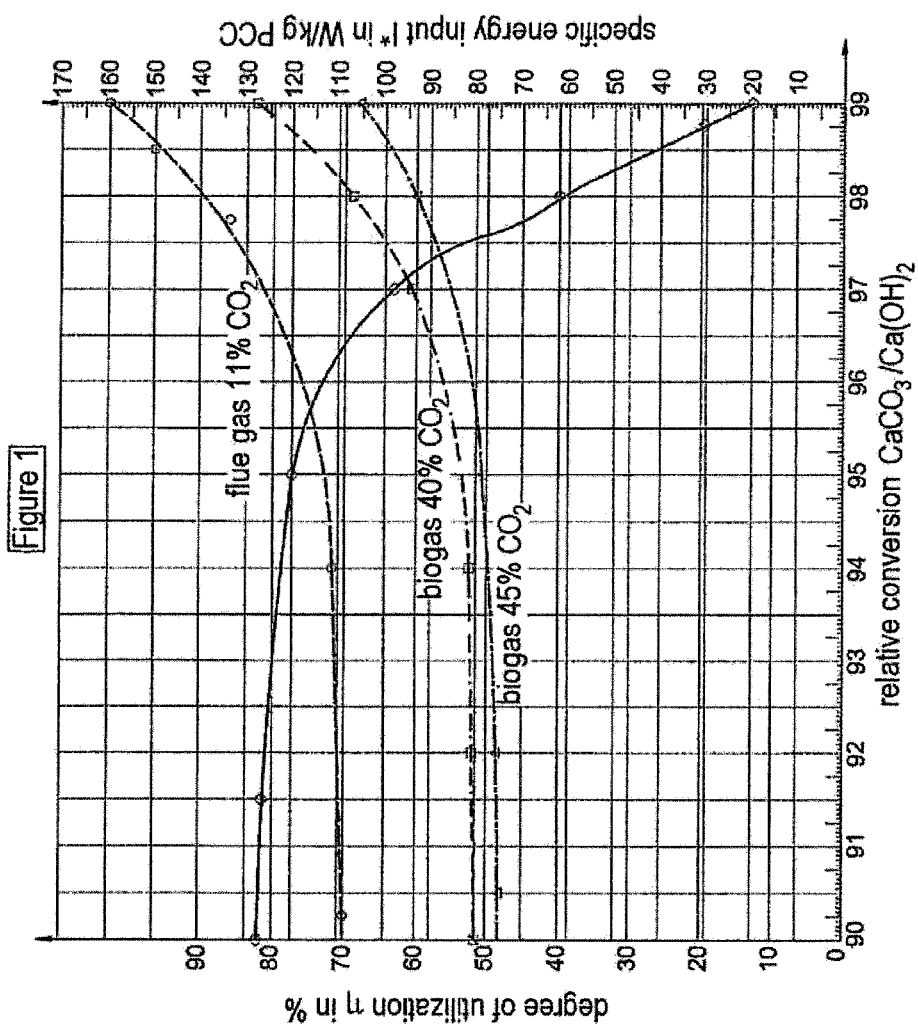
FIG. 1 shows the measured dependence of the degree of gas utilization on the relative conversion of $CaCO_3/Ca(OH)_2$ and the dependence of the specific energy input on the relative conversion of $CaCO_3/Ca(OH)_2$ for a continuously operating reactor of step a).
Figure 2:
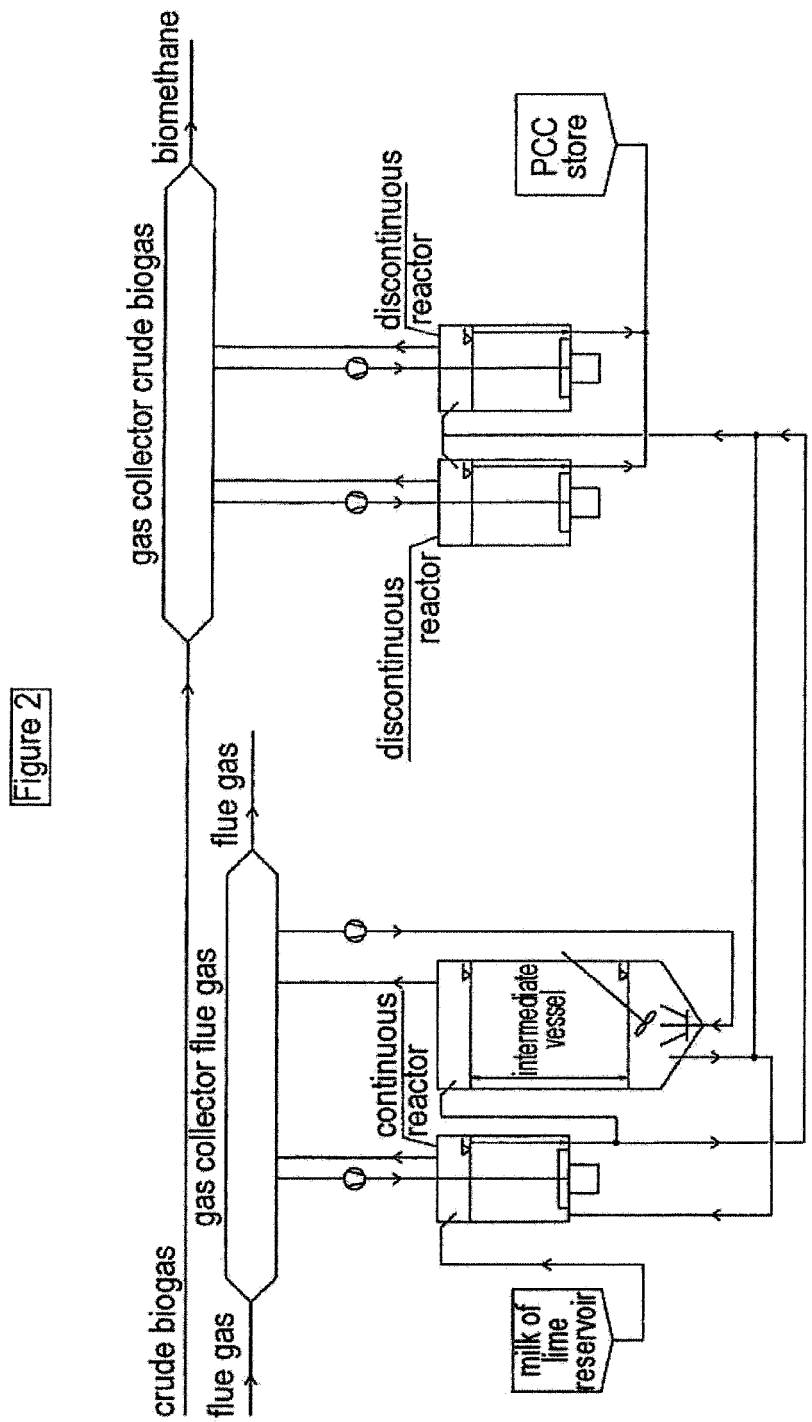
FIG. 2 shows the schematic of an exemplary system for carrying out the method according to the invention with an intermediate vessel.
Figure 3:
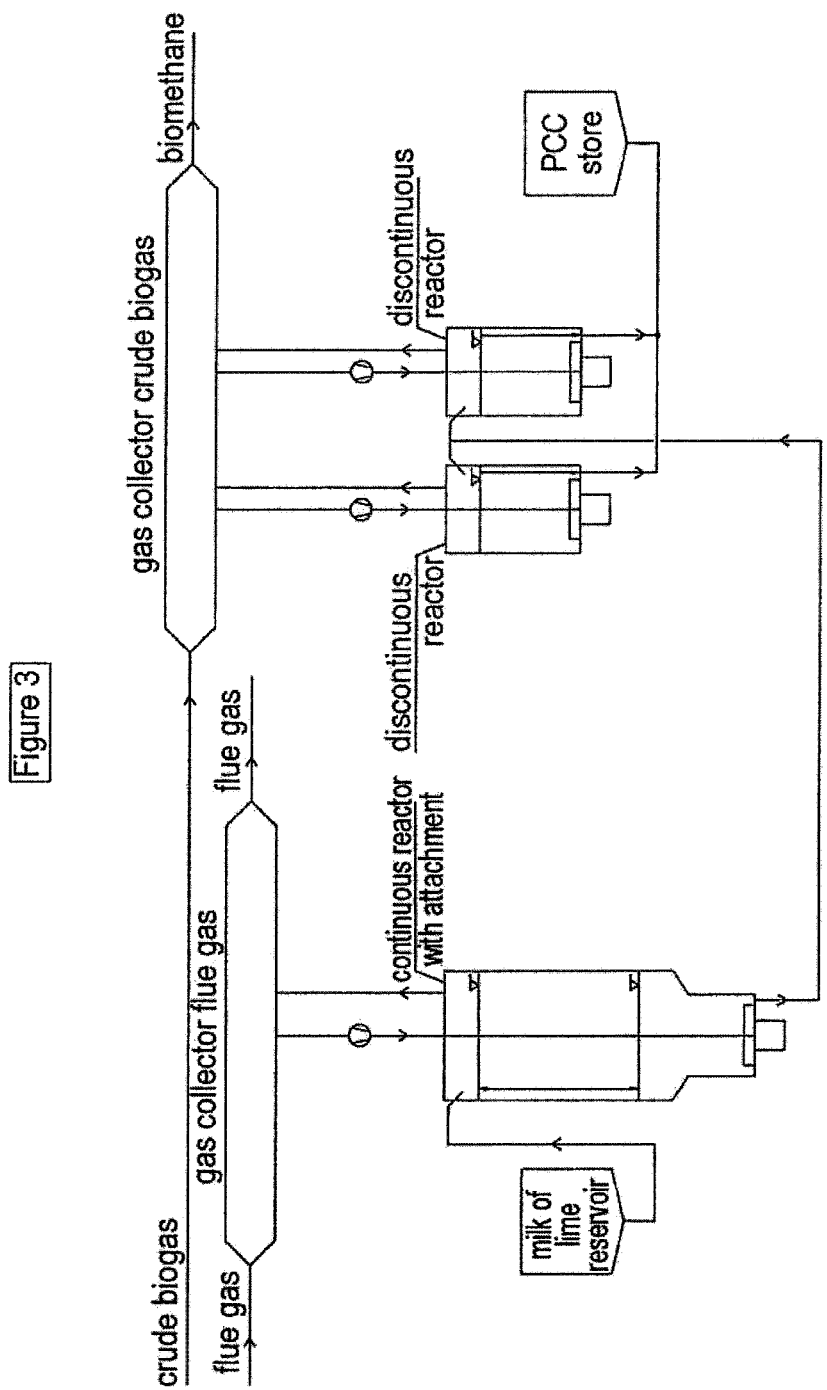
FIG. 3 shows the schematic of an exemplary system for carrying out the method according to the invention with a conical reactor attachment.
Figure 4:
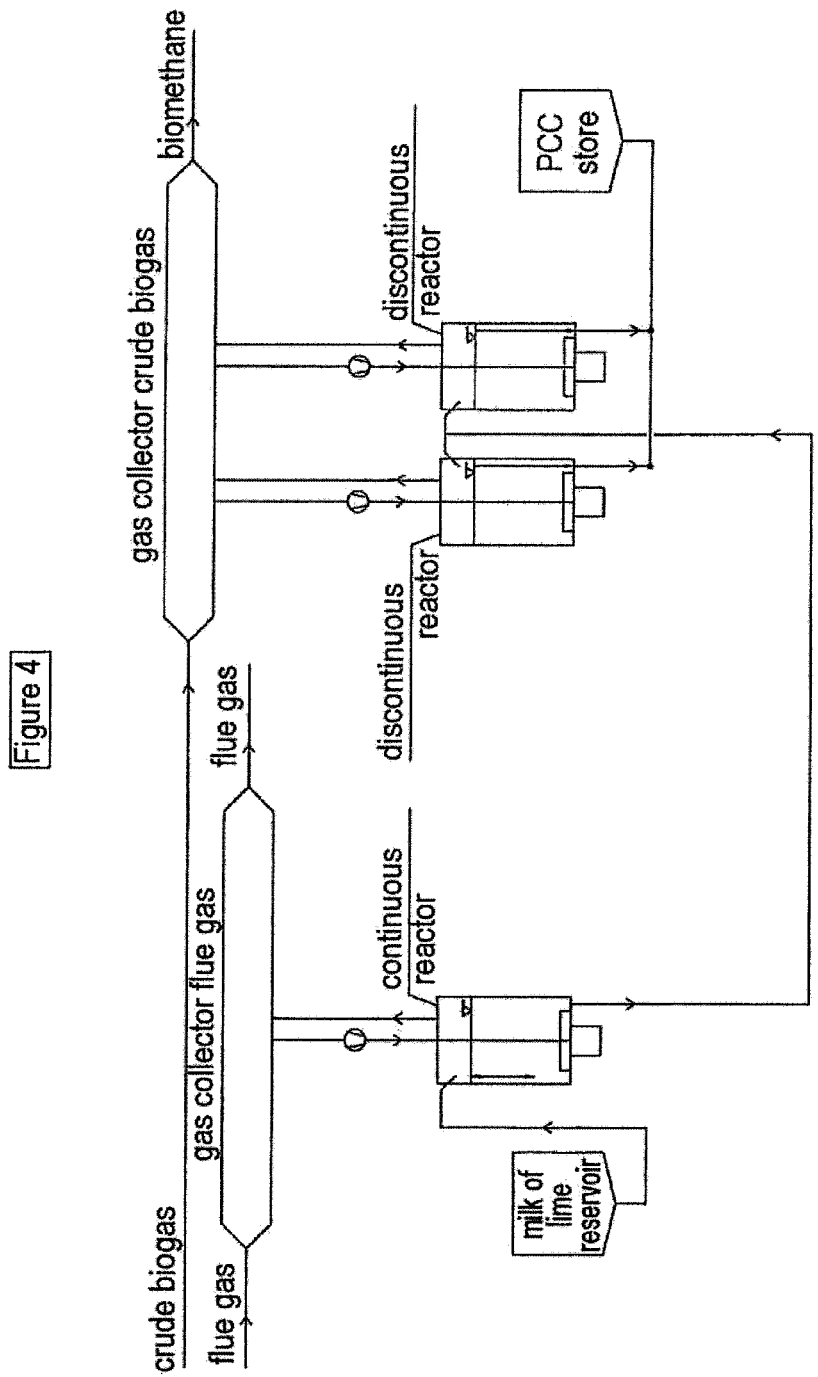
FIG. 4 shows the schematic of an exemplary system for carrying out the method according to the invention with a continuous reactor which operates at constant or variable fill level, and is directly connected to a plurality of discontinuous reactors.

Hereinafter, the invention will be described in more detail with reference to examples.

Example 1: Scalenohedral PCC (s-PCC)

To produce S-PCC, an arrangement having an intermediate vessel was used. Reactor 1 was continuously operated with a fill level of 600 l. The desired degree of saturation of $Ca(OH)_2$ was set, in that the average residence time of the milk of lime was set to 2.6 h; the conductivity was 5.2 mS/cm. The degree of saturation of $CO_2$ in the solution was set via the speed of rotation of the turbine in combination with a connected fan to a relatively low value (1180 rpm), which corresponded to a $CO_2$ conversion rate of about 75%. Flue gas having a $CO_2$ content of 17% served as supply gas.

The intermediate vessel, the volume of which possessed three times the volume of the continuously operated reactor, was filled to maximum volume (1800 l). Thereafter, it was pumped out batchwise into the discontinuously operating reactor and the reaction was conducted to completion there. In this case, biogas having a $CO_2$ content of 35% was used. A part of the amount of gas was provided here by circulating air.

Hereinafter, the parameters for the production of S-PCC are summarized:

$C_{milk\ of\ lime}$=17% by weight
$t_{milk\ of\ lime}$=20° (at the start of slaking)
$d_{50}$ of the calcium hydroxide crystallites=3.2 μm volumetric throughput$_{milk\ of\ lime}$=3.73 l/min
Step 1: Continuous with recirculation via intermediate vessel
  Reactor volume 600 l, equipped with self-priming gas-introduction turbine, supported by fan,
  Gas throughput 40 Nm³/h; speed of rotation reduced to 1180 rpm by frequency converter
$c_{CO2\ in}$=17% (flue gas)
$c_{CO2\ out}$=4.25%
t=45° C. (controlled to be constant)
Conversion rate U=45%
Mean residence time=2.6 h (based on reactor)
Mean residence time=10.7 h (based on reactor and intermediate vessel)
Output of transfer pump from reactor to intermediate vessel and return=30 l/h
$V_{intermediate\ vessel}$=1800 l (equipped with cup agitator 1.5 kW)
Step 2: Discontinuous, withdrawal from intermediate vessel
  $V_{reactor}$=600 l (equipped with gas-introduction turbine with admission pressure,
  speed of rotation=1480 rpm/admission pressure by fan=100 mbar, with circulating air
  Gas throughput=52 m³/h
  $c_{CO2\ in}$=35%
  $c_{CO2\ out}$=20%
  Reaction time=120 min
  Start temperature=45° C., uncontrolled
  Post aeration for stabilization:
  $c_{CO2\ in}$=35%
  $c_{CO2\ out}$=33%
  Gas-introduction data identical to those described in step 2,
  Reaction time: =0.17 h
  Temperature=uncontrolled
  Characterization of the end product:
    morphology: scalenohedral, aggregated, $d_{50}$ 1.7 μm
  Characterization the energy consumption figures:
    specific energy consumption step 1 with continuous operation: 93 kWh/t CaCO₃
    specific energy consumption of step 2 with batch operation without post-gas-introduction for stabilization: =74 kWh/t CaCO₃
    specific energy consumption for post-gas-introduction, lance aeration with flue gas=34 kWh/t CaCO₃

Example 2: Nano-PCC (n-PCC)

For production of nano-PCC, an arrangement was chosen in which the intermediate vessel (which was connected to the continuously operated reactor 1) was larger than reactor 1 by the factor of 21. The throughput of milk of lime was set in reactor 1 in such a manner that a conductivity of approximately 6 mS/cm resulted, which corresponded in turn to a residence time of the milk of lime of 0.44 h. The degree of $CO_2$ saturation was very high, owing to the fact that the speed of rotation of the turbine was selected at 1776 rpm and in addition owing to the fact that the fresh gas feed had been throttled. Flue gas having a $CO_2$ content of 24% was selected as supply gas.

The contents of reactor 1, in which the crystal morphology generated is determined by the parameter set selected, were pumped continuously into the intermediate vessel and from there were transferred batchwise into a further reactor of the same size with respect to volume. There, a combination of greatly reduced speed of rotation and fill level of the reactor was selected in such a manner that a relatively low $CO_2$ conversion resulted (76%). For gas-introduction, biogas having a $CO_2$ content of 28% was used. The reaction, meaning here post-gas-introduction and stabilization, was conducted to completion in a further externally arranged reactor. For this purpose biogas was used, and the gas-introduction system was in this case a self-priming turbine.

Hereinafter the parameters are summarized for the production of nano-PCC:
$C_{milk\ of\ lime}$=7.2 by weight
$t_{milk\ of\ lime}$=30° C. (at the start of slaking)
$d_{50}$ of the calcium hydroxide crystallites=2.0 μm
volumetric throughput$_{milk\ of\ lime}$=22.5 l/min
Step 1: continuous with recirculation via additionally gas-treated intermediate vessel
  Reactor volume 600 l, equipped with self-priming gas-introduction turbine
  Speed of rotation 1776 rpm; gas-introduction rate 40 Nm³/h
  Electric power uptake turbine: =27 kW
  Specific conversion rate U:=30%
  $c_{CO2\ in}$=24%
  $c_{CO2\ out}$=1.4%
  Temperature t: =25° C., controlled to be constant
  Conversion rate U: =30%
  Mean residence time=0.44 h (based on reactor)
    =9.8 h (based on reactor and intermediate vessel)
  Transfer pump from reactor to intermediate vessel and return=10 l/h
  $V_{intermediate\ vessel}$=12 600 l, equipped with agitator 3 kW
  Lance aeration with 5 Nm³/h with $c_{CO2}$=24% (flue gas)
Step 2: Discontinuous, withdrawal from intermediate vessel
  $V_{reactor}$=600 l, equipped with self-priming gas-introduction turbine (speed of rotation=1184 rpm)/gas-introduction rate 80 Nm³/h
  Power uptake turbine=15 kW
  Power uptake fan=5 kW
  $c_{CO2\ in}$=28%
  $c_{CO2\ out}$=13.7%
  Temperature t=30°, controlled to be constant
  Reaction time 1.5 h
  Post treatment and stabilization externally by means of self-priming turbine, use of biogas, special treatment.
  Characterization of the end product:
    morphology: more than 90% calcite,
    habit: cubic, slightly aggregated, $d_{50}$ 130 nm
  Characterization of the energy consumption figures:
    specific energy consumption step 1 with continuous operation: supplied with flue gas: 142 kWh/t CaCO₃
    specific energy consumption of step 2 with biogas, with batch operation without post gas-introduction for stabilization: 61 kWh/t CaCO₃
    specific energy consumption of the post-gas-introduction and post treatment with biogas and turbine aeration: 32 kWh/t CaCO₃

Example 3: Rhombohedral PCC (r-PCC)

For production of rhombohedral FCC (r-PCC), in the first continuous step a reactor was used, on the lower part of which a further container (expansion cone) was attached, the volume of which was 6.25 times greater than that of the reactor situated beneath. The lower part of the reactor had a working volume of about 3 m³, the attachment contained an additional 18.75 m³. Flue gas containing 17% $CO_2$ was used for the gas-introduction. A low turbine speed of rotation (880 rpm) was set. In combination with the additional geodetic height of the attachment, a degree of utilization of the $CO_2$ introduced of approximately 43.7% resulted. The conductivity as a measure of the relative saturation of the system for $Ca(OH)_2$ was 4.9 ms/cm. This value resulted from the residence time of the milk of lime which, based on the lower active part of the reactor, was about 0.33 h. The residence time based on the entire volume of the reactor was 2.4 h.

Contents were withdrawn discontinuously from the upper part of the expansion cone and in a further reactor having a working volume of about 10 m³, the reaction was conducted to the end. The parameters were able to be varied here within a wide range without recognizable effect on the crystal morphology. The parameters of the turbine ultimately determine the time requirement for this part of the reaction. In this manner, the time requirement using this reactor arrangement depending on the preconditions of running operation, were able to be set between 0.12 h and 0.2 h. The time of 0.12 h described in the example was achieved at a turbine speed of rotation of 1480 rpm in self-priming mode without additional connection of an admission pressure fan.

The parameters for production of r-PCC are summarized hereinafter:

Quick lime selected: Producer was Felswerke Saal a.D.
$C_{milk\ of\ lime}$=13.0% by weight (end of slaking)
$t_{milk\ of\ lime}$=27° C. (beginning of the slaking reaction)
$d_{50}$ of the calcium hydroxide crystallites=5.0 µm
volumetric throughput$_{milk\ of\ lime}$=153 l/min
$c_{CO2}$ (flue gas)=17% (inlet concentration)
Step 1: Continuous with attached reactor part which is expanded in diameter, lower reactor part with fan-supported turbine gas-introduction, gas-introduction rate 2200 Nm³/h, speed of rotation=888 rpm, power requirement for turbine: 65 kW, power requirement for fan: 35 kW.
$V_{reactor}$: lower part of the reactor=3000 l (height 1.9 m)
upper part of the reactor; including expansion cone=18750 l (height$_{overall}$ 2.5 m)
$c_{CO2\ in}$=17% (flue gas)
$c_{CO2\ out}$=7.42%
Temperature t=20° C., control to be constant
Conversion rate U=58.2%
Mean residence time=0.33 h (based on the lower reactor part)
=2.4 h (based on the overall volume)
Step 2 discontinuous, withdrawal from partially converted suspension from the upper part of the reactor,
$V_{reactor}$: =10,000 l
Gas-introduction with self-priming turbine, gas-introduction rate 3000 Nm³/h, speed of rotation 1480 rpm, motor with power uptake of 185 kW
$c_{CO2\ in}$=47% (biogas from collector of the front part)
$c_{CO2\ out}$=4.6%
Temperature=20° C. at the start of reaction, uncontrolled afterwards
Reaction time=9 min
Post-introductions-introduction for stabilization in external reactor=6 min with simple lance aeration.
$c_{CO2\ in}$=17% (flue gas)
$c_{CO2\ out}$=16%
Characterization of the end product:
morphology: rhombohedral, slightly aggregated,
$d_{50}$: 1.7 µm
BET surface area: 8 m²/g
Characterization of the energy consumption figures:
specific energy consumption step 1 with continuous operation: supplied with flue gas: 88 kWh/t $CaCO_3$
specific energy consumption of step 2, using 47% biogas, with batch operation without post-gas-introduction for stabilization: 57 kWh/t $CaCO_3$
specific energy consumption of the post-gas-introduction with flue gas and lance aeration: 25 kWh/t $CaCO_3$
Energetic utilization of the flue gas before compression and before introduction into the reactors:
Flue gas amount: 2200 Nm³ with 44% $H_2O$ content corresponding to 320 g/m³ 11% $CO_2$, temperature after leaving the kiln: 88° C.
Flue gas after cooling to 40° C.: $H_2O$ content 51 g/m³, $CO_2$ concentration 17.6%,
heat recovery by cooling to 40° C.=412 kWh
utilization of this heat for warming 8.4 m³ fermentation effluents from 28° C. to 70° C., without heat recovery, requirement: 410 kWh,
the warmed fermentation effluents were advantageously fed to $NH_3$ stripping.

Example 4: Acicular PCC (Flue Gas with 11% of $CO_2$ Continuous, Biogas 47% of $CO_2$ Discontinuous)

For production of a-PCC, an arrangement was selected in which a large continuously operated reactor was supplied with flue gas. From this reactor of the first step, a plurality of smaller reactors which themselves had biogas introduced, were charged successively and reacted to completion batchwise. The throughput of the milk of lime in the continuous reactor was set in such a manner that a relative degree of conversion of $Ca(OH)_2$ to $CaCO_3$ of 50% resulted, corresponding to a conductivity of approximately 5.6 mS/cm. This corresponded to a residence time of the milk of lime of 0.8 per h under the data set chosen here. The gas-introduction turbine was operated in combination with a fan, the operating data of gas-introduction turbine and fan were matched to one another, in such a manner that although a relatively low efficiency of the $CO_2$ conversion resulted, this correlated to an especially optimal energetic efficiency.

From reactor 1, in which, owing to the selected parameter set, the type and manner of slaking carried out and the quick lime sought out determined the crystal morphology generated, contents were continuously transferred directly into a plurality of smaller reactors, and there the remainder of the carboxylation including the post-gas-introduction was carried out batchwise. Here, the parameters of the gas-introduction were selected in such a manner that, in one passage, the biogas was able to be freed from $CO_2$ to such an extent that conditions suitable for feeding into the grid resulted. The post-gas-introduction was carried out in this case in a third reactor using flue gas already reacted to completion.

Hereinafter, the parameters for producing a-PCC are summarized:

Quick lime selected: producer Felswerke Saal a.D.
$C_{milk\ of\ lime}$=13.0% by weight (end of slaking)
$t_{milk\ of\ lime}$=30° C. (start of slaking)
$d_{50}$ of the calcium hydroxide crystallites=5.0 µm
volumetric=1.043 m³/min
throughput$_{milk\ of\ lime}$
further additives none
addition of seed crystals none
step 1: continuous without recirculation to additional intermediate vessel
reactor volume: 50 m³, equipped with self-priming gas-introduction turbine, 270 kW power uptake, steppeddown gears, offtake drive speed of rotation 700 rpm, additional an multi-step, admission pressure of the compressed flue gas 320 mbar, power uptake of the fan: 105 kW, gas-introduction rate=14 300 Nm$^3$/h $c_{CO2\ in}$=11.0%

$c_{CO2\ out}$=2.42% temperature t=60° C., controlled to be constant conversion rate U=50% (relative fraction Ca(OH)$_2$ to CaCO$_3$)

step 2: discontinuous, head space gas-introduction via collection tube, reactor volume: 14 m$^3$, equipped with self-priming gas-introduction turbine, 185 kW drive, with additional fan, single-stage, admission pressure of the compressed biogas 150 mbar, connection of the fan 34 kW, of drive speed of rotation of the turbine: 1480 rpm, gas-introduction rate 4000 Nm$^3$/h, fresh gas fraction 2000 Nm/h, $c_{CO2\ in}$=45%

$c_{CO2\ out}$=1.8% temperature t=60° C., at start of reaction, thereafter uncontrolled, reaction time=11 min post-gas-introduction for stabilization=0.1 h with following data set:

$c_{CO2\ in}$=9%

$c_{CO2\ out}$=8.1% carried out in external vessel by means of simple lance aeration.

Characterization of the end product:
morphology: acicular, slightly aggregated
mean length about 3.2 to 3.6 μm
mean width about 0.4 to 0.6 μm
characteristic ratio length to width about 6.8

Characterization of the energy consumption figures:
specific energy consumption step 1, with 11.0% flue gas, under continuous operation: 71 kWh/t CaCO$_3$
specific energy consumption of step 2 (with biogas, 45% CO$_2$) under batch operation without post-gas-introduction: 62 kWh/t CaCO$_3$

The invention claimed is:

1. A method for producing crystalline calcium carbonate by reacting calcium hydroxide with CO$_2$, the calcium hydroxide being provided as milk of lime, the method comprising a first step and a second step, wherein:
    a) the first step comprising nucleation is carried out continuously with exclusive use of flue gas that comprises 11 to 17% of CO$_2$ in one or more reactors, a fill level of the reactor(s) being optionally variable, by feeding the flue gas into the one or more reactors using a gas-introduction turbine having parameters set in dependence on the fill level in the one or more reactors react a maximum of 90% of the milk of lime to calcium carbonate and
    b) the second step comprising crystal growth and crystal stabilization performed is separate from the nucleation in the first step, wherein crystal growth and crystal stabilization are carried out batchwise on the calcium carbonate subjected to nucleation in the first step with exclusive use of a biogas that comprises 30 to 99% of CO$_2$ in the one or more reactor(s), a fill level of the one or more reactor(s) being optionally variable, wherein complete conversion of any remaining milk of lime from the first step is controlled by setting independently of one another the parameters of the gas-introduction turbine that introduces the biogas into the one or more reactor(s).

2. A method according to claim 1, characterized in that the biogas comprises a CO$_2$ content between 0.1 and 3% after the second step.

3. A method according to claim 1, characterized in that the fill level employed in step a) is variable.

4. A method according to claim 1, characterized in that the fill level employed in step b) is variable.

5. A method according to claim 1, characterized in that a variable fill level for the reactor(s) in step a) is ensured by an intermediate vessel communicating with the respective reactor, said intermediate vessel connected between the reactor(s) of the first step and the reactor(s) of the second step.

6. A method according to claim 5, characterized in that an intermediate vessel gas-introduction turbine for introducing a flue gas to partially reacted milk of lime in association with the intermediate vessel, and an agitator for stirring the milk of lime are provided.

7. A method according to claim 5, wherein a volume of the intermediate vessel is between equal to and twenty times the volume of the reactor.

8. A method according to claim 1, characterized in that a gas-introduction rate and a bubble size are set independently of one another as gas-introduction parameters in steps a) and b).

9. A method according to claim 1, characterized in that admission pressure and speed of rotation of the gas-introduction turbine are set independently of one another in steps a) and b).

10. A method according to claim 1, characterized in that a desired crystal form of the calcium carbonate crystals is controlled in step a) by setting independently of one another a calcium hydroxide concentration of the milk of lime, a mean hydraulic residence time of the milk of lime in the reactor, a degree of saturation of the milk of lime with CO$_2$, a conversion rate of calcium hydroxide to the desired crystal grown form of the calcium carbonate crystals, and a reaction temperature.

11. The method according to claim 1 wherein the gas-introduction turbine is operated with admission pressure.

12. A method according to claim 1, wherein the gas-introduction turbine operates according to a rotor-stator principle, wherein the flue gas flows into a working region of a rotor and is conducted thereby radially outwards into stator channels.

13. A method for producing crystalline calcium carbonate by reacting calcium hydroxide with CO$_2$, the calcium hydroxide being provided as milk of lime, and the method comprising nucleation of calcium carbonate nuclei in a first step and crystal growth in a second step that is separate from the nucleation in the first step, wherein:
    a) the first step comprises nucleation is carried out continuously with exclusive use of a flue gas that comprises 11 to 17% CO$_2$ in one or more reactors, a fill level of the reactor(s) being optionally variable, by feeding the flue gas based on the fill level in the one or more reactors to provide flue gas into the one or more reactors in order to react a maximum of 90% of the milk of lime to calcium carbonate,
    b) the second step comprises crystal growth and crystal stabilization separate from the nucleation in the first step carried out batchwise on the calcium carbonate subjected to nucleation in the first step with exclusive use of a biogas that comprises 30 to 99% of CO$_2$ in the one or more reactor(s), a fill level of the reactor(s) being optionally variable, wherein complete conversion of any remaining milk of lime from the first step is controlled by setting independently of one another the introduction of the biogas into the one or more reactor(s).

* * * * *